United States Patent [19]

den Boef

[11] Patent Number: 4,682,110
[45] Date of Patent: Jul. 21, 1987

[54] METHOD OF REDUCING ARTEFACTS IN IMAGES FORMED BY MEANS OF FOURIER ZEUGMATOGRAPHY

[75] Inventor: Johannes H. den Boef, Eindhoven, Netherlands

[73] Assignee: U.S. Philips Corporation, New York, N.Y.

[21] Appl. No.: 707,707

[22] Filed: Mar. 4, 1985

[30] Foreign Application Priority Data

Mar. 5, 1984 [NL] Netherlands .......................... 8400699

[51] Int. Cl.$^4$ .......................................... G01R 33/20
[52] U.S. Cl. .................................... 324/309; 324/312
[58] Field of Search .................... 324/307, 309, 312; 364/413–415

[56] References Cited

U.S. PATENT DOCUMENTS

| | | | |
|---|---|---|---|
| 4,115,730 | 9/1978 | Mansfield | 324/309 |
| 4,443,760 | 4/1984 | Edelstein et al. | 324/309 |
| 4,506,223 | 3/1985 | Bottomley et al. | 324/307 |
| 4,573,014 | 2/1986 | Riederer | 324/312 |

Primary Examiner—Stewart J. Levy
Assistant Examiner—Kevin D. O'Shea
Attorney, Agent, or Firm—Robert T. Mayer; Algy Tamoshunas

[57] ABSTRACT

NMR images formed by means of Fourier zeugmatography contain disturbing artefacts which are caused by coherent interference signals (for example, offset signals, non-ideal 180° reversing pulses). In accordance with the invention, alternating phase (90°) excitation pulses are used in the successive measurement cycles and the signal samples taken during the measurement cycles are stored in adjacent rows of an image frequency matrix. The values in every second row of the matrix are inverted, so that the contributions of the coherent interference signals change their sign in every row in the direction of the columns. During the Fourier transformation of the columns, therefore the artefacts caused by the interference signals are shifted towards the edge of the image.

13 Claims, 6 Drawing Figures

METHOD OF REDUCING ARTEFACTS IN IMAGES FORMED BY MEANS OF FOURIER ZEUGMATOGRAPHY

The invention relates to a method of determining a nuclear magnetic resonance distribution in a region of a body which is situated in a steady, uniform magnetic field which is generated in a first direction, including the steps of:

(a) generating a high-frequency electromagnetic pulse whose magnetic field direction extends perpendicularly to the field direction of the uniform magnetic field in order to cause a precessional motion of the magnetization of nuclei in the body about the first field direction, thus generating a resonance signal, (b) then applying at least one gradient magnetic field during a preparation period, the field direction thereof being coincident with the first direction, (c) then taking a set of (n) signal samples during a measurement period, (d) then repeating, each time after a waiting period, a measurement cycle comprising the steps (a), (b) and (c) for a plurality of (n') repetitions, the integral of the intensity of at least one gradient field over the preparation period having a different value at each repetition in order to provide (n') sets of (n) signal samples in a matrix-organised storage arrangement from which, after Fourier transformation thereof, an image of the distribution of the induced nuclear magnetization is determined.

The invention also relates to a device for determining the nuclear magnetic resonance distribution in a region of a body, comprising:

(a) means for generating a steady, uniform magnetic field, (b) means for generating high-frequency electromagnetic radiation, (c) means for generating at least a first and a second gradient magnetic field whose gradient directions are mutually perpendicular, (d) sampling means for sampling, during a measurement period, a resonance signal generated by the means specified in paragraphs (a) and (b), after conditioning the resonance signal during a preparation period by means of at least one gradient magnetic field generated by the means specified in paragraph (c), (e) processing means for processing the signals provided by the sampling means, and (f) control means for controlling at least the means specified in paragraphs (b) to (e) for generating, conditioning, sampling and processing a plurality of resonance signals, each resonance signal being respectively conditioned during a preparation period, the control means supplying the means specified in paragraph (c) with control signals for adjusting the intensity and/or the duration of at least one gradient magnetic field, the respective integral of the intensity over the duration of at least one gradient magnetic field being different after each waiting period.

As used herein, the term "nuclear magnetic resonance distribution" is to be understood to mean a nuclear magnetic density distribution, a flow velocity distribution, a relaxation time $T_1$, $T_2$ distribution or a nuclear magnetic resonance frequency spectrum distribution (NMR location-dependent spectroscopy), etc.

Furthermore the term "resonance signal" is to be understood herein to relate both to a resonantly excited population of spin nuclei and to the free induction decay (FID) signals generated thereby.

Such a method (also referred to as Fourier zeugmatography) and device are known from the German Patent Application DE-OS No. 26.11.497. According to such a method, a body to be examined is subjected to a strong, steady, uniform magnetic field Bo whose field direction coincides with, for example the z-axis of a cartesian coordinate system (x, y, z). The steady magnetic field Bo causes a slight polarization of the nuclear spins present in the body and enables a precessional motion of nuclear spins to occur about the direction of the magnetic field Bo. After the application of the magnetic field Bo, a preferably 90° pulse of high-frequency electromagnetic radiation is generated (with an angular frequency $\omega = \cdot \cdot$ Bo, in with $\cdot \cdot$ is the gyromagnetic ratio and Bo is the intensity of the magnetic field) in order to rotate the direction of magnetization of the spin nuclei present in the body through an angle (90°). After the termination of the 90° pulse, the nuclear spins will start to perform a precessional motion about the field direction of the magnetic field Bo, thus generating a resonance signal (FID signal). Using the gradient magnetic fields $G_x$, $G_y$, $G_z$ whose field directions all coincide with that of the magnetic field Bo, a total magnetic field $B = Bo + G_x \cdot x + G_y \cdot y + G_z \cdot z$ can be generated whose intensity is location-dependent, because the intensity of each gradient magnetic field $G_x$, $G_y$, $G_z$ has a respective gradient in the x, the y and the z direction.

After the 90° pulse, a field $G_x$ is applied for a period $t_x$ and subsequently a field $G_y$ for a period $t_y$, so that the precessional motion of the excited nuclear spins is modified in a location-dependent manner. After this preparation period (i.e. after $t_x + t_y$), a field $G_z$ is applied and the FID signal (actually the sum of all magnetizations of the nuclei) is sampled at $N_z$ measurement instants during a period $t_z$. The described measurement procedure is subsequently repeated $l \times m$ times, different values being used on each occasion for $t_x$ and/or $t_y$. Thus, $(N_z \times m \times l)$ signal samples are obtained which contain information concerning the magnetization distribution in a region of the body in the x, y, z space. The $l \times m$ measured sets of $N_2$ signal samples are stored in a memory (in $N_z \times m \times l$ memory locations), after which an image of the distribution of the nuclear magnetic resonance is obtained by 3-D Fourier transformation of the sampled values of the FID signals. It will be apparent that it is alternatively possible, using selective excitation, to generate the FID signal from nuclear spins only in a 2-dimensional slice (having an orientation which can be selected at random) so that, for example an FID signal need only be generated m times in order to obtain an image of the magnetization distribution at $m \times N_z$ points in the selected slice by means of a 2-dimensional Fourier transformation.

Using the described method, a nuclear spin density distribution is determined in a 2-dimensional slice or a 3-dimensional volume. Using a similar method, it is possible to determine, for example for each pixel in a slice or volume, a frequency spectrum which represents the metabolic (chemical) state of matter in the region corresponding to the relevant pixel. To achieve this, for example, no gradient field should be applied during the measurement period, while 1, 2 or 3 gradient fields should be applied during the preparation period. Using such a method, a 2-, 3- or 4-dimensional matrix is filled with signal samples which are converted into location-dependent frequency spectra after a 2-D, 3-D or 4-D Fourier transformation, the location-dependency then being in 1, 2 or 3 dimensions (for example, x, or x,y or x,y,z).

The image of the nuclear magnetic resonance distribution obtained by means of 2-dimensional or 3-dimensional NMR Fourier zeugmatography as described above, however, contain artefacts which disturb the information present in the NMR image or which even (partly) cancel this information. The NMR images are obtained by a 2-D or a 3-D Fourier transformation on the measured, demodulated resonance signals which consist of low-frequency signals having a frequency f in a range $0 \leq f \leq f_{max}$. The image artefacts are usually due to undesired signals in this frequency range. A first type of artefact becomes apparent as a pixel at the center of the image which has a different intensity and is caused by offset voltages, etc. A further type of artefact is formed by a second image which is superposed on the first image. Artefacts of this kind occur when non-ideal 180° pulses are used when employing the so-called spin echo technique. Such artefacts are referred to hereinafter as being caused by coheren interference signals. Due to these coheren interference signals, actually two types of information are intermingled which is of course, extremely annoying and undesirable. One solution to the problem of removing such artefacts is to perform two measurements with respect to each signal sample in the matrix, the excitation phase of the resonance signal during the first measurement being opposite to that during the second measurement. The addition of the two signal samples then compensate for the errors occurring, thus reducing the artefacts. However, such a solution requires a measurement which takes twice as long and is, therefore, undesirable.

It is an object of the invention to provide a method and a device for forming NMR images which are not disturbed by artefacts (even when spin echo NMR techniques are used) and in which the time required for taking the signal samples is no longer than in the known method and devices in which the occurrence of artefacts is not avoided.

To achieve this, a method in accordance with the invention is characterized in that in the various measurement cycles which succeed one another with respect to a corresponding succession of values of the integral of the intensity of the gradient field over the preparation period, the resonance signals are excited in such a way that between the resonance signals which are associated with the successive rows there is introduced an additional phase difference $\Delta\psi$ and that the introduced additional phase differences being cancelled for Fourier transformation of values present in columns of the matrix.

A first version of a method in accordance with the invention is characterized in that the phase difference $\Delta\psi$ is equal to $\pi$ rad/sec or to $(n'-1) \cdot \pi/n'$ rad/sec, $n'$ being the number of rows.

A further version of a method in accordance with the invention is characterized in that the number of rows $n'$ is even, the additional phase difference $\Delta\phi$ being equal to $\pi$ rad/s which is obtained by alternating excitation of the resonance signals in phase opposition in the measurement cycles for the successive rows, values present either in the odd rows or in the even rows being inverted for Fourier transformation of values present in columns of the matrix.

As a result of the use of the porposed method the following is achieved: the signal samples obtained during the measurement cycles are stored in a matrix-organised store, the row position (the row index number) of the respective signal samples (n) to be stored in a row being determined by the sequence of values of the integral of the intensity of the gradient magnetic field over the preparation period in the various successive measurement cycles. A coherent interference signal, for example an offset signal which is generated by the electronic circuits required for the detection and sampling of the resonance signal, will occur in the same sense for each signal sample. However, when signal samples are taken from every second row of a matrix-stored assembly of sampled resonance signals which have been excited alternately in phase opposition, the effect on the coherent interference signals, after inversion of every second row, will be to reverse its sign each time from one row to the next row. Consequently, after Fourier transformation over the columns of the matrix, the effect will occur only in the edge elements of the columns of the image matrix, because the interference signals whose sign changes for each successive row, will only contain the highest frequency occurring in the matrix. As a result of the use of alternating the excitation phase therefore, the contribution of the offset voltage to the central pixel (frequency 0) will be shifted to the edge of the image; this has a substantially less disturbing effect. It is to be noted that the alternating coherent interference signals are converted into a known point spread function by the Fourier transformation, the position of the maximum of said function being determined by the number of values in the columns. When this number is even, the maximum of the point spread function will be situated at one side of the column in the outermost column element. In all other column elements, the value of the p.s.f. will be zero. When a column contains an odd number of values, the outermost elements which are situated on both sides of the column will receive a highest contribution from the p.s.f. The successive neighbouring elements will receive an increasingly smaller contribution, as the distance from the outermost element increases (becoming a minimum for the central element of the column).

When the spin echo NMR technique is used, 180° excitation pulses are applied in order to generate a spin echo signal. The 180° pulse rotates the phase of the spins through 180°. However, when non-ideal 180° pulses are used, the inversion of the spins will not be ideal and some of the spins will assume a different phase other than the intended 180° rotated phase. Moreover, undesired spins will also be put in the intended 180° rotated phase, because the 180° excitation pulse is coherent with the 90° excitation pulse. The undesirably excited nuclear spins make a signal contribution which is superposed on the desired resonance signal which leads, after Fourier transformation to undesired image information which is interleaved with the desired image information in an image thus provided.

By performing the (90°) excitation of the resonance signal in an alternating phase relationship in accordance with the invention, the coherent interference signal generated by the incorrectly excited nuclear spins will, after inverting the signal samples in every second row of the matrix, be shifted across the columns by Fourier transformation, to the edge of the image thus computed. It is to be noted that for the most effective reduction of image artefacts caused by non-ideal 180° pulses, the preparatory gradient magnetic field is preferably generated during the period between the 90° excitation pulse and the 180° pulse.

A preferred version of a method in accordance with the invention in which the value of the integral of the intensity of the gradient field over the preparation period is incremented by the same amount for each subsequent measurement cycle is characterized in that the resonance signal is alternately excited in phase opposition during the successive measurement cycles, the value of the signal samples of each second number of signal samples thus measured being inverted for the Fourier transformation of the values in the columns.

The invention can also be used for performing three-dimensional Fourier zeugmatography. A version of a method of determining a nuclear magnetic resonance distribution in a three-dimensional region of a body which is situated in a generated, steady, uniform magnetic field, including the steps of:

(a) generating a high-frequency electromagnetic pulse in order to cause a precessional motion of the magnetization of nuclei in the body, thus generating a resonance signal, (b) then applying, during a preparation period, at least a first and a second preparatory gradient magnetic field whose gradient directions are mutually perpendicular, (c) then taking, during a measurement period, a set of (n) sample signals of the resonance signal, (d) then repeating, each time after a waiting period, a measurement cycle comprising the steps (a), (b) and (c) for a plurality of (m×n') repetitions, a first integral which comprises the integral of the intensity of the first gradient field over the preparation period having a first number (m) of different values whilst a second integral which comprises the integral of the intensity of the second gradient field over the preparation period has a second number (n') of different values in order to provide said first number (m) of planes each with said second number (n') of rows of (n) sampling signals in a three-dimensional matrix from which, after Fourier transformation thereof, an image of the distribution of the induced nuclear magnetization in a three-dimensional region of a body is determined, is characterized in that the resonance signal is excited in the various measurement cycles which succeed one another with respect to a corresponding succession of values of the integral of the intensity of the first gradient field over the preparation period in such a way that between the resonance signals of said successive measurement cycles there is introduced an additional phase difference $\Delta\psi$ which is equal to $\pi$ rad/s or to $(m-1)\cdot\pi/m$ rad/s, m being the number of planes, the introduced additional phase differences being cancelled for Fourier transformation of values from the m planes.

A further version of a method in accordance with the invention for determining a nuclear magnetic resonance distribution in a three-dimensional region of a body is characterized in that the number of planes m is even, the additional phase difference being $\pi$ rad/s which is obtained by alternating excitation of the resonance signals in phase opposition in the successive measurement cycles, values in every second plane being inverted for Fourier tranformation of the values of the signal samples which are present in the first number (m) of planes of the matrix. The set of stacked two-dimensional matrices is thus filled with signal samples. Each row of a two-dimensional matrix can be filled with signal samples which are each taken after the same excitation phase. The successive matrices are filled with signal samples which have been taken with an alternation in the phase of the excitation of the resonance signal from one matrix to another. After a three-dimensional Fourier transformation, the artefacts are either shifted to the image plane associated with the highest frequency occurring in the image frequency matrix (in the case of an even number of planes) or spread between the two outermost and directly adjacent planes in accordance with a known point spread function (in the case of an odd number of planes).

When the signal samples are taken from a resonance signal which is alternately excited in phase opposition from one row to another during the process of filling a matrix with signal samples, then, after 3-D Fourier transformation, the artefacts will be shifted to the edge of the outermost plane (in the case in which the number of planes and the number of rows are even numbers) or will be spread out into the outermost rows on both sides of the outermost plane (in the case in which the number of planes is even and the number of rows is odd).

Furthermore, it is also possible to reduce only artefacts caused by the non-ideal $\frac{1}{2}$° pulse (artefacts due to, for example offset voltages must then be separately avoided or removed).

In a version of a method in accordance with the invention for determining the nuclear magnetization distribution in a region of a body which is situated in a steady, uniform magnetic field which is generated in a first direction, and including the steps of:

(a) generating a high-frequency electromagnetic pulse in order to cause a precessional motion of the magnetization of nuclei in the body about the first field direction, thus generating a resonance signal, (b) then applying, during the preparation period, at least one gradient magnetic field, (c) then generating a 180° high-frequency electromagnetic pulse at least once in order to reverse the direction of the nuclear magnetization, thus generating a nuclear spin echo signal, a set of (n) signal samples being taken during a measurement period which succeeds the 180° pulse and which is divided into a number of sampling intervals for periodically taking the set of (n) signal samples of the nuclear spin echo signal, (d) then repeating, each time after a waiting period, the steps (a), (b) and (c) for a plurality of (n') repetitions, the integral of the intensity of at least one gradient field over the preparation period then having at each repetition a different value in order to obtain a group of signal samples from which, after Fourier transformation thereof, an image of the distribution of the induced nuclear magnetization is determined, is characterized in that the 180° electromagnetic pulse is alternately generated in phase opposition during the various measurement cycles which succeed one another with respect to a corresponding succession of values of the integral of the intensity of the gradient field over the preparation period.

A device in accordance with the invention is characterized in that the control means comprise programmed computer means for generating and applying control signals to the means for generating high-frequency electromagnetic radiation, said control signals being suitable for generating, in accordance with a programmed schedule, a 90° excitation pulse having either a first phase or a second phase during a measurement cycle, the second phase being shifted 180° with respect to the first phase. Using such a device, the described methods can be performed without giving rise to said artefacts, as has already been explained.

The invention will be described in detail hereinafter with reference to an embodiment shown in the accompanying drawing; therein.

Figure 1:
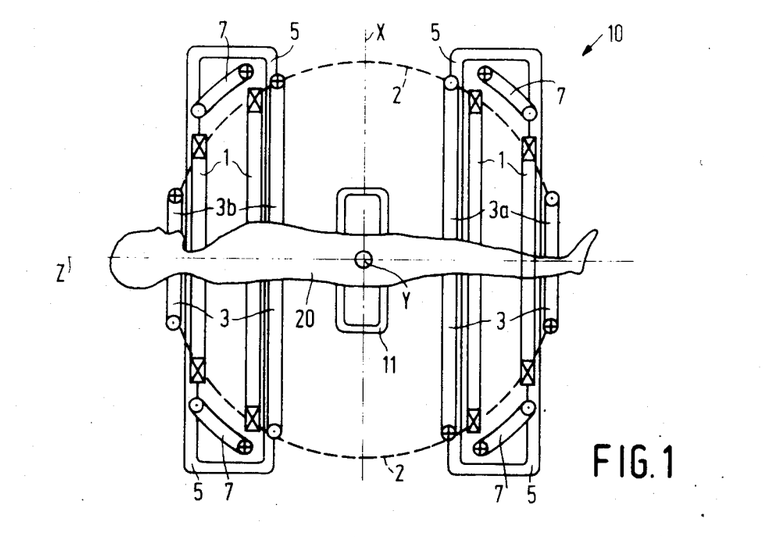
FIG. 1 shows diagrammatically a configuration of a coil system of a device for performing a method in accordance with the invention.

FIG. 1 shows a coil system 10 which forms part of a device 15 (FIG. 2) used for determining an NMR distribution of spin nuclei in a region of a body 20. This region has a thickness of, for example Δz and is situated in the x-y plane of the x-y-z coordinate system shown in FIG. 1. The y-axis of the system extends upwardly perpendicularly to the plane of drawing. The coil system 10 generates a uniform steady magnetic field Bo having a field direction parallel to the z-axis, three gradient magnetic fields $G_x$, $G_y$ and $G_z$ having a field direction parallel to the z-axis and a gradient direction parallel to the x, y and z-axis, respectively, and a high-frequency magnetic field. To achieve this, the coil system 10 comprises a set of main coils 1 for generating the steady magnetic field Bo having an intensity of from 0.3 to 1.5 Tesla. The main coils 1 may be arranged, for example on the surface of a sphere 2 whose center is situated at the origin O of the cartesian coordinate system x, y, z, the axes of the main coils 1 being coincident with the z-axis.

The coil system 10 furthermore comprises, for example four coils $3_a$, $3_b$ which are arranged on the same spherical surface and which generate the gradient magnetic field $G_z$. To achieve this, a first coil set $3_a$ is excited by current in the opposite sense with respect to the current in the second set $3_b$; this is denoted by ⊕ and ⊙ in the Figure. Therein, ⊙ means a current entering the section of the coil 3 and ⊕ means a current leaving the section of the coil.

The coil system 10 comprises, for example four rectangular coils 5 (only two of which are shown) or four other coils such as, for example "Golay-coils" for generating the gradient magnetic field $G_y$. In order to generate the gradient magnetic field $G_x$ use is made of four coils 7 which have the same shape as the coils 5 and which have been rotated through an angle of 90° about the z-axis with respect to the coils 5. FIG. 1 also shows a coil 11 for generating and detecting a high-frequency electromagnetic field.

Figures 2, 6:
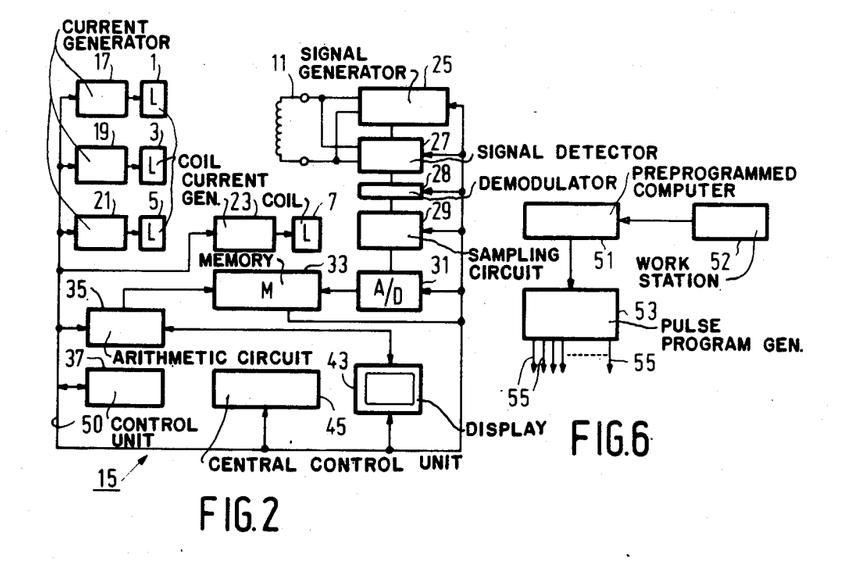
FIG. 2 shows a block diagram of a device for performing the method in accordance with the invention.
FIG. 6 shows a part of a device for performing the method in accordance with the invention.

FIG. 2 shows a device 15 for performing a method in accordance with the invention. The device 15 comprises coils 1, 3, 5, 7 and 11 which have already been described with reference to FIG. 1, current generators 17, 19, 21 and 23 for exciting the coils 1, 3, 5 and 7, respectively, and a high-frequency signal generator 25 for exciting the coil 11. The device 15 also comprises a high-frequency signal detector 27, a demodulator 28, a sampling circuit 29, processing means such as an analog-to-digital converter 31, a memory 33 and an arithmetic circuit 35 for performing Fourier transformations, a control unit 37 for controlling the sampling instats, and also a display device 43 and central control means 45 whose functions and relationships will be described in detail hereinafter.

The device 15 performs a method of determining the NMR distribution of spin nuclei in a body 20 as will be described hereinafter. The method involves the frequent repetition of a measurement cycle which itself can be divided into several steps. During a measurement cycle, some of the spin nuclei present in the body are resonantly excited. For the resonant excitation of the spsin nuclei, the current generator 17 is first switched on by the central control unit 45 so that the coil is energized and remains energized during the susequent measurement cycles, thus generating a steady and uniform magnetic field Bo. Then, the high-frequency generator 25 is switched on for a brief period of time, so that the coil 11 generates a high-frequency electromagnetic field (r.f. field). Certain spin nuclei in the body 20 can be excited by the applied magnetic fields and the resultant precessional nuclear magnetization will take up a given angle, for example 90° (90° r.f. pulse) with respect to the uniform magnetic field Bo. The location in the body region and the element whose spin nuclei will thus be resonantly excited, will depend inter alia on the intensity of the field Bo, on any gradient magnetic field applied, and on the angular frequency $\omega_o$ of the high-frequency electromagnetic field, because, for resonance, the equation $\omega_o = \gamma \cdot Bo$ (1) has to be satisfied, in which $\gamma$ is the gyromagnetic ratio. (For free protons, for example $H_2O$ protons, $\gamma/2\cdot\pi = 42.576$ MHz/T. After an excitation period, the high-frequency generator 25 is switched off by the central control means 45. The resonant excitation is always performed at the beginning of each measurement cycle. For some methods of operation, r.f. pulses are also induced in the body during the measurement cycle. These r.f. pulses can be, for example 180° r.f. pulses or a series composed of 180° r.f. pulses which are periodically induced into the body. The latter generates a response which is referred to as "multiple spin echo". Spin echo techniques are inter alia described in the article by I. L. Pykett "NMR in Medicine" published in Scientific American, May 1982.

During a next step usable sampling signals are collected. For this purpose use is made of the gradient fields which are generated by the generators 19, 21 and 23, respectively, under the control of the central control means 45. The detection of the resonance signal (referred to as the free induction decay or FID signal) is performed by switching on the high-frequency detector 27, the demodulator 28, the sampling circuit 29, the analog-to-digital converter 31 and the control unit 37. This FID signal appears as a result of the precessional motion of the nuclear magnetization about the field direction of the magnetic field $\overline{B}_o$ resulting from the excitation produced by the r.f. excitation pulse. The precessional effect of this nuclear magnetization induces an induction voltage in the detection coil whose amplitude is a measure of the amount of nuclear magnetization.

The analog, sampled FID signals originating from the sampling circuit 29 are digitized (converter 31) and stored in a memory 33. After a final sampling signal has been taken at an instant $t_e$, the central control means 45 deactivates the generators 19, 21 and 23, the sampling circuit 29, the control unit 37 and the analog-to-digital converter 31.

The sampled FID signal is and remains stored in the memory 33. Subsequently, a next measurement cycle is performed durinfg which an FID signal is generated, sampled and stored in the memory 33. When a sufficient number of FID signals have been measured (the number of FID signals to be measured depends, for example, on the desired resolution), an image is formed by means of a 2D or 3D Fourier transformation (this depends on the use of the gradient magnetic fields under whose effects the FID signals are generated and sampled).

Figure 3:
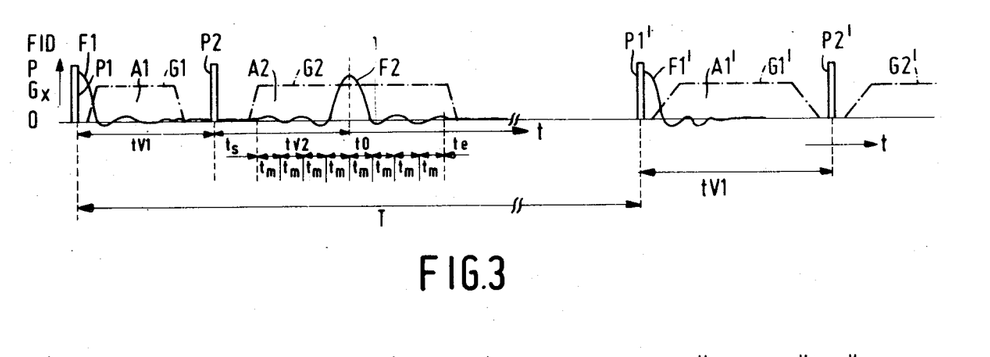
FIG. 3 illustrates a simple form of a method in accordance with the state of the art.

FIG. 3 shows an example of a measurement cycle in accordance with the present state of the art which will be illustrated with reference to the device 15 shown in FIG. 2. Using the high-frequency coil 11, a 90° pulse $P_1$ is generated after the switching on of the main coils 1 which generate a steady, uniform magnetic field Bo. The resultant resonance signal (FID signal) $F_1$ is allowed to decay when using the spin-echo technique and after a period of time $t_{v1}$ a 180° pulse $P_2$ is generated by the high-frequency coil 11. During a part of the period $t_{v1}$ a gradient field $G_X$ (denoted by a curve $G_1$) is generated for reasons to be described hereinafter. After a period of time $t_{v2}$ which is equal to $t_{v1}$, an echo resonance signal (spin-echo FID signal) $F_2$ produced by the 180° pulse $P_2$ will reach a peak value. The use of the so-called spin-echo technique (180° pulse $P_2$) prevents the occurrence of phase errors in the resonance signals produced by the spin nuclei; such errors are caused by non-uniformities in the steady magnetic field Bo. The echo resonance signal is sampled at sampling intervals $t_m$ in the presence of a gradient magnetic field $G_x$ which is denoted by a curve $G_2$.

It is known that the phase angle of magnetization at a point x in a gradient magnetic field $G_x$ is determined by $$\int^t \gamma \cdot G_x(\tau) x \cdot d\tau$$

Thus, an image frequency $k_x$ can be defined:

$$k_x = \gamma \int^t G_x(\tau) \cdot d\tau.$$

Thus, after each sampling period $t_m$ a respective signal sample will be determined which is associated with a different image frequency $k_x$. The successive image frequencies will exhibit an image frequency difference $$\Delta k_x = \gamma \int_{tm} G_x \cdot (\tau) \cdot d\tau.$$

It will be apparent that when the described measurement cycle is repeated during which a further gradient field $G_y$ is applied for some time before sampling takes place, signal samples will be obtained which are associated with image frequency pairs $(k_x, k_y)$. In the absence of a gradient magnetic field $G_y$, signal samples will thus be obtained which are associated with the image frequencies $(k_x, O)$. It can be demonstrated that when a group of signal samples is collected which are assocatfted with a matrix of image frequency pairs $(k_x, k_y)$ in which the image frequencies range from $-k_x$ to $+k_x$ and from $-k_y$ to $+k_y$, the distribution of magnetization can be determined in an x-y plane from this group of signal samples by means of a 2D Fourier transformation. After the expiration of a period of time T which comprises the measurement cycle started by the pulse $P_1$, a next measurement cycle is started with a similar measurement pulse $P_1'$ in order to take a new series of signal samples which are associated with image frequency pairs $(k_x, k_y)$, $k_y$ being constant and predetermined in that during the period $t_{v1}'$ between the pulses $P_1'$ and $P_2'$ a gradient field $G_y$ (not shown) is applied in addition to a gradient field $G_1$. The period of time T elapsing between the respective starts of two successive measurement cycles amounts to from 0.5 to 1 second in the methods according to the present state of the art. A further reduction of this period of time will be at the expense of the magnitude of the FID signal generated during the next measurement cycle, because a substantial proportion of the excited spin nuclei will have a comparatively long relaxation time with respect to such a shorter period of time. Only that proportion of the spin nuclei whose spin axes have relaxed back into the direction of the main field Bo will then make a contribution to the next spin echo signal.

Figure 4:
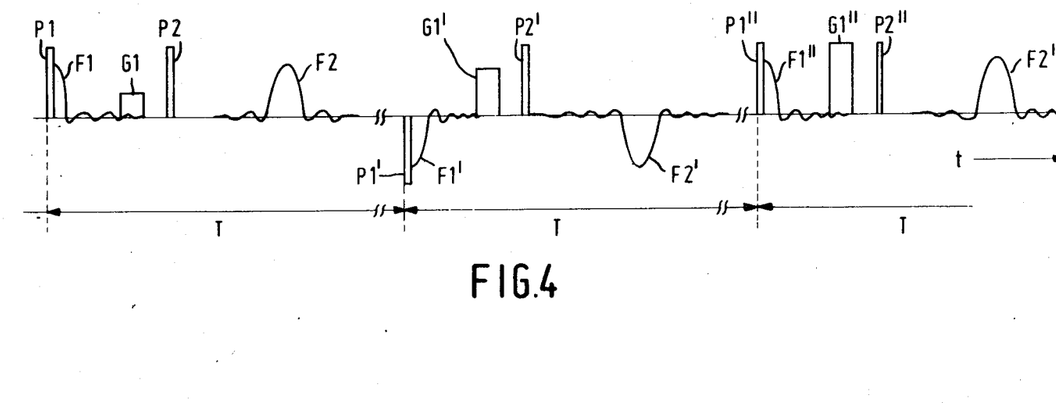
FIGS. 4 and 5 illustrate respective preferred forms of a method in accordance with the invention.

FIG. 4 illustrates a measurement cycle of a method in accordance with the invention. This measurement cycle is substantially identical to the measurement cycle shown in FIG. 3. For the sake of clarity, FIG. 4 does not show gradient fields and only the relevant signals such as the excitation pulses $P_1$, $P_1'$, the 180° pulses $P_2$, $P_2'$ and the resonance signals $F_1$, $F_1'$, $F_2$, $F_2'$. Furthermore, in the successive measurement cycles (each having a duration T) the various (preparatory) gradient magnetic fields $G_1$, $G_1'$, $G_1''$, . . . are also shown. The successive measurement cycles differ from one another in the following respects: the successive 90° excitation pulses $P_1$, $P_1'$, $P_1''$ . . . etc. are alternately generated in phase opposition (which means that the high-frequency pulse $P_1'$ is phase-shifted 180° with respect to the phase of the high-frequency pulse $P_1$, $P_1''$) and the intensity of the successive gradient fields $G_1$, $G_1'$, $G_1''$, . . . are increased in a step-wise manner. Due to the step-wise increase of the gradient field $G_1$ for each measurement cycle T, adjacently situated rows of signal samples will be provided in the $(k_x, k_y)$ image frequency matrix from the successively occurring spin echo signals $F_2$, $F_2'$, $F_2''$.

Due to the alternation of the phase of the excitation pulse, the phase of the initial FID signals $F_1$, $F_1'$, $F_1''$, . . . and hence of the spin echo signals $F_2$, $F_2'$, $F_2''$, . . . will also alternate. The effect of alternating the excitation phase on the spin echo signal can be compensated for by inverting the sample values of every second row. Because the nature of the excitation does not affect coherent interference signals, the contribution of such interference signals will have an alternating sign from one column to another due to the inversion of the sample values in every second row. The undesirable contribution of, for example the offset signal, will actually be raised from a frequency "0" to the highest available frequency as determined by the sampling theorem, in a column; consequently, upon Fourier transformation it will be shifted to the edge (edges) of the transformed column in accordance with the already described point spread function.

Figure 5:
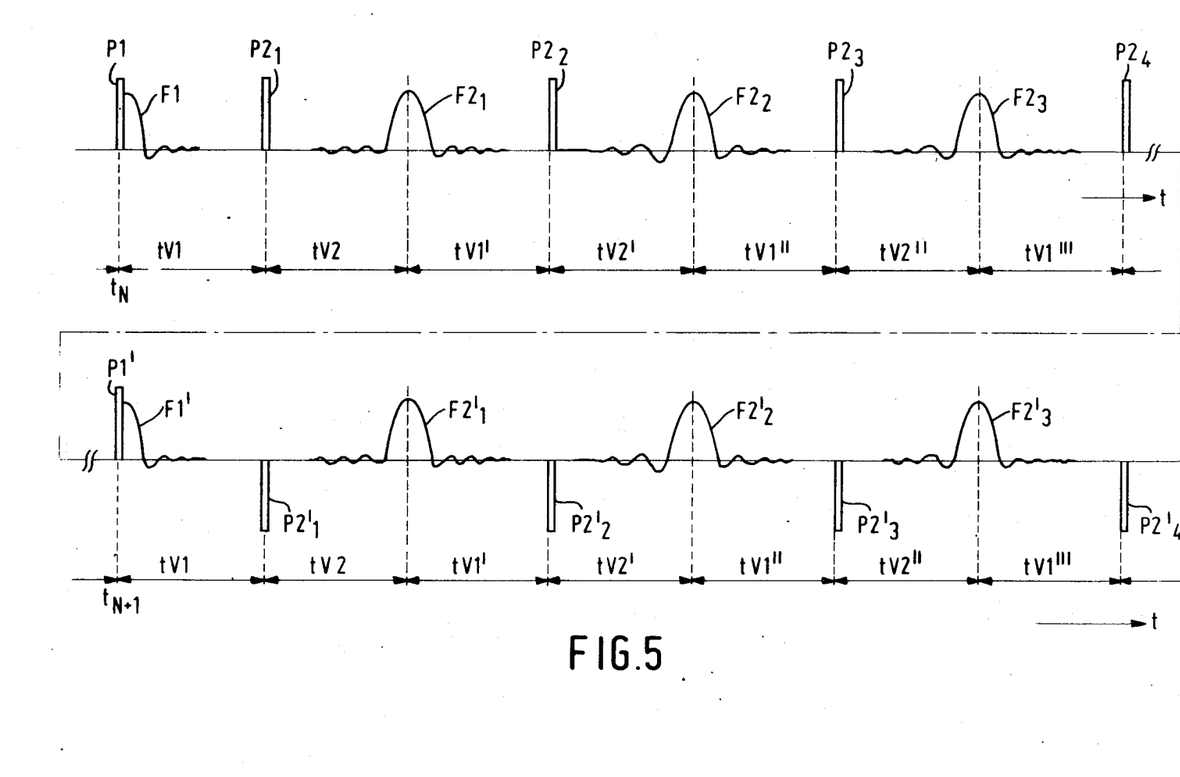

FIG. 5 shows an example of a method in accordance with the invention used for the so-called multiple-echo technique. After a 90° excitation pulse $P_1$, a plurality of nuclear magnetic resonance signals $F2_1$, $F2_2$, $F2_3$, . . . are generated at intervals by means of 180° reversing pulses P2₁, P2₂, P2₃, . . . In practice the high-frequency electromagnetic reversing pulses P2₁, P2₂, . . . are not ideal; consequently, the resonance signals F2₁, F2₂, . . . will contain contributions of nuclear spins which would not be present if the 180° pulses were perfect. The resonance signals are sampled, the signal samples of a first, second, third, . . . resonance signal $F2_1$, $F2_2$, $F2_3$, . . . being stored in a row of a first, a second, a third, . . . image frequency matrix. After the end of the measurement cycle which started at the instant $t_N$, the next measurement cycle is started at the instant $t_{N+1}$. This measurement cycle is identical to the preceding cycle except for a preparatory gradient field (omitted for the sake of clarity) and the 180° high-frequency reversing pulses $P2_1'$, $P2_2'$, . . . which are generated with a 180° phase-shift with respect to the phase of the 180° high-frequency reversing pulses $P2_1$, $P2_2$, . . . of the preceding measurement cycle. The resonance signals $F2_1'$, $F2_2'$, $F2_3'$ . . . thus generated are sampled in the same way as during the preceding measurement cycle and the signal samples are stored in the matrices in the same way. By applying a step-like increment to the preparatory gradient field in each successive measurement cycle, the adjacently situated rows in each image frequency matrix can be filled in succession. Due to the 180° reversing pulses $P2_1$, $P2_2$, $P2_1'$, $P2_2'$ . . . which alternate in phase from one measurement to the next, the coherent interference signals generated by the non-ideal 180° reversing pulses will be stored in the matrix with a sign which will alternate from one row to the next. Consequently, after Fourier transformation of the image frequency matrix into an image matrix, the interference signals will cause image artefacts only at one edge (or at two edges as described above).

Methods have been described thus far in which the undesirable signal contributions alternate in phase opposition from one row to another in the measured image frequency matrix, with the result tht the artefacts in the image matrix are shifted to the edge thereof. However, alternating excitation in phase opposition will not be required in all situations. The additional phase difference between the resonance signals associated with the successive rows (or planes) in the image frequency matrix has the value $\Delta\psi=(n'-1)\cdot\pi/n'$ in the optimum case, n' being the number of rows (or planes). For a proper understnding, a description will now be given of a one-dimensional situation where a signal is sampled equidistantly in time with a sampling interval tj. The bandwidtth Fw of the sampled signal is $Fw=1/tj$ after Fourier transofmration, and the resolution (spacing of the frequency) amounts to $\Delta f=1/(NS\times tj)$, in which NS is the number of signal samples taken. The highest frequency ($F_{max}$) occurring in the spectrum amounts to $F_{max}=NS\cdot\Delta f/2$ in the case of an even number of samples, and to $F_{max}=(NS-1)\cdot\Delta f/2$ in the case of an odd number of samples. The phase difference between two successive samples (for this highest frequency) will then be $\Delta\psi=2\pi\cdot F_{max}/tj$. After substitution of $1/tj=\Delta f\cdot NS$ and the formule for $F_{max}$ it follows that the phase difference amounts to $\Delta\psi=\pi$ when NS is even and to $\Delta\psi=(NS-1)\cdot\pi/NS$ when NS is odd.

For the selection/adjustment of a given pulse sequence and the associated time intervals for a measurement cycle, use is preferably made of preprogrammed computer means. In one embodiment of the device 15 (FIG. 2) the central control means or unit 45 comprises a preprogrammed computer 51 with an input/output work station 52 for control data and a pulse program generator 53 (see FIG. 6). Outputs 55 of the pulse program generator 53 are connected, via the bus 50 (see FIG. 2), to the current generators 17, 19, 21, 23 and 25 to be controlled by the generator 53 for the coils 3a, b, 5, 7 and 11. It will be apparent that the outputs 55 can also be directly connected to said generators. The computer (Philips type P857) is programmed in accordance with the program which is given hereinafter in the appendix; on the basis of this program it controls the pulse program generator 53 (Nicolet type 293B) by means of the program and control data to the input via the work station 52. The set of instructions used in the program (third column in the program) is the instruction set of the pulse program generator 53 (with the exception of the instruction: JSA which results in a jump to the start address). Each entry in the fourth column defines a period of time during which the output signals should be present at the outputs of the generator 53. The fourth column of the program indicates the state of the outputs 55 of the generator 53 in a hexadecimal code (with the exception of the letter S). The fifth column states an address or memory location. The sumbol I in the sixth column indicates the presence of an interrupt which can fetch additional functions in conjunction with a part of the code to be output on the outputs 55 of the generator, for example: (a) "load" the generator 25 with a new waveform (for a 180° pulse instead of a 90° pulse); (b) reverse the phase of an excitation pulse; or (c) indication of the beginning of a new pulse sequence. The program given in the appendix utilizes exclusively + or −y pulses for the 90° excitation pulses and exclusively +x pulses for the 180° pulses.

```
0000   PPD021      : NAME OF PULSE PROGRAM
0001   830519      : VERSION DATE OF PULSE PROGRAM
0002   100         : DWELL TIME IN MICRO-SECONDS.
0003   0           : START ADDRESS OF PULSE PROGRAM
0004               = 0 FOR RHO-T2  ; 1 FOR RHO-T1  ; 2 FOR RHO-T2-T1
0005   +           : FREE
0006
0007   256                         ; COUNTER 1 = NUMBER OF TIME-SAMPLES PER ECHO
0008   1                           ; COUNTER 2 = NUMBER OF ECHO'S
0009   1                           ; COUNTER 3 = USED FOR RF ADJUSTING
0010   98,60                       ; COUNTERS 4+5 FOR 180 DEGREES PULSE
0011   78,100                      ; COUNTERS 6+7 FOR 90 DEGREES PULSE
0012   END                         ;
0013
0014   900M                        ; DURATION 0 = TREP - 125MS  (C2 - 1)*5.2MS
0015   3M,10M,2.2M,10M             ; DURATIONS 1,2,3 AND 4
```

```
0016   6M,25M,3M,10M,7.2M         ; DURATIONS 5,6,7,8 AND 9
0017   367M                        ; DURATION 10 = T1-DELAY TIME - 33MS
0018   250U,200U,100U              ; DURATIONS 11,12,13 AND 14
0019   6M,7M                       ; DURATIONS 15,16
0020   END                         ;
0021
0022    0 JUC  D2  S8900E 6     I ; START FOR RHO-T2 , RESET WAVEFORM GENERATOR
0023    1 JUC  D2  S8900E 29    I ; START FOR RHO-T1 ,          "
0024    2 JUC  D2  S8900E 53    I ; START FOR RHO-T2-T1 ,       "
0025    3 JUC  D2  S8900E 76    I ; START FOR ADJUSTMENT OF RF.
0026    4 JUC  D2  S8900E 100   I ; START FOR MEASURING RF PULSES.
0027
0028    6 NOP  D5  S0010E          ; SKIP 180 T1 PULSE
0029    7 NOP  D6  S00E0E          ; SKIP GRADIENT WAVEFORMS
0030    8 LD1  D4  S0013E C1       ; 90 DEGREES +/-Y RF PULSE , LOAD LOOP COUNTER
0031    9 JUC  D1  S00E0E 11       ; START/STOP GRADIENTS
0032   10 IJ1  D11 S0000E 12       ; NS/2 * TDWELL LOOP
0033   11 JUC  D11 S0000E 10       ;
0034   12 LD2  D3  S00E0E C2       ; START/STOP GRADIENTS , C2=NUMBER OF ECHO'S
0035   13 LD1  D5  S0018E C1       ; 180 DEGREES +X RF PULSE , LOAD LOOP COUNTER
0036   14 NOP  D8  S02E0A          ; START/STOP GRADIENTS
0037   15 JUC  D13 S02E00 18       ; START/STOP GRADIENTS
0038   16 IJ1  D11 S00000 20       ; NS * TDWELL LOOP
0039   17 NOP  D11 S00000          ;
0040   18 NOP  D11 S00001          ; ADC SAMPLE PULSE
0041   19 JUC  D11 S00001 16       ;
0042   20 IJ2  D9  S00E0C 23       ; START/STOP GRADIENTS , ALL ECHO'S DONE ?
0043   21 NOF      S0100E          ; RESET WAVEFORM GENERATOR
0044   22 JUC  D7  S00E0E 13       ; START/STOP GRADIENTS
0045   23 NOP  D16 S5000E        I ; PHASE ALTERNATE Y
0046   24 JUC  D0  S0000E 0      I ; RECYCLE
0047
0048   29 NOP  D5  S0018E          ; 180 DEGREES INVERSION PULSE
0049   30 NOP  D10 S0000E          ; T1 DELAY TIME
0050   31 NOP  D6  S00E0E          ; SKIP GRADIENT WAVEFORMS
0051   32 LD1  D4  S0013E C1       ; 90 DEGREES +/-Y RF PULSE , LOAD LOOP COUNTER
0052   33 JUC  D1  S00E0E 35       ; START/STOP GRADIENTS
0053   34 IJ1  D11 S0000E 36       ; NS/2 * TDWELL LOOP
0054   35 JUC  D11 S0000E 34       ;
0055   36 LD2  D3  S00E0E C2       ; START/STOP GRADIENT  C2=NUMBER OF ECHO'S
0056   37 LD1  D5  S0018E C1       ; 180 DEGREES +X RF PULSE , LOAD LOOP COUNTER
0057   38 NOP  D8  S02E0A          ; START/STOP GRADIENTS
0058   39 JUC  D13 S02E00 42       ; START/STOP GRADIENTS
0059   40 IJ1  D11 S00000 44       ; NS * TDWELL LOOP
0060   41 NOP  D11 S00000          ;
0061   42 NOP  D11 S00001          ; ADC SAMPLE PULSE
0062   43 JUC  D11 S00001 40       ;
0063   44 IJ2  D9  S00E0C 47       ; START/STOP GRADIENTS , ALL ECHO'S DONE ?
0064   45 NOF      S0100E          ; RESET WAVEFORM GENERATOR
0065   46 JUC  D7  S00E0E 37       ; START/STOP GRADIENTS
0066   47 NOP  D16 S5000E        I ; PHASE ALTERNATE Y
0067   48 JSA  D0  S0000E        I ; RECYCLE
0068
0069   53 NOP  D5  S0010E          ; SKIP 180 T1 PULSE
0070   54 NOP  D6  S00E0E          ; SKIP GRADIENT WAVEFORMS
0071   55 LD1  D4  S0013E C1       ; 90 DEGREES +/-Y RF PULSE , LOAD LOOP COUNTER
0072   56 JUC  D1  S00E0E 58       ; START/STOP GRADIENTS
0073   57 IJ1  D11 S0000E 59       ; NS/2 * TDWELL LOOP
0074   58 JUC  D11 S0000E 57       ;
0075   59 LD2  D3  S00E0E C2       ; START/STOP GRADIENTS , C2=NUMBER OF ECHO'S
0076   60 LD1  D5  S0018E C1       ; 180 DEGREES +X RF PULSE , LOAD LOOP COUNTER
0077   61 NOP  D8  S02E0A          ; START/STOP GRADIENTS
0078   62 JUC  D13 S02E00 65       ; START/STOP GRADIENTS
0079   63 IJ1  D11 S00000 67       ; NS * TDWELL LOOP
0080   64 NOP  D11 S00000          ;
0081   65 NOP  D11 S00001          ; ADC SAMPLE PULSE
0082   66 JUC  D11 S00001 63       ;
0083   67 IJ2  D9  S00E0C 70       ; START/STOP GRADIENTS , ALL ECHO'S DONE ?
0084   68 NOF      S0100E          ; RESET WAVEFORM GENERATOR
0085   69 JUC  D7  S00E0E 60       ; START/STOP GRADIENTS
```

```
0086   70 NOP  D0   S0000E           ;
0087   71 JUC  D2   S0100E 1         ; GOTO RHO-T1 CYCLUS
0088
0089   76 LD1  D14  S02000 C3        ; SCOPE TRIGGER
0090   77 JUC  D14  S02082 79        ; ADC TRIGGER
0091   78 IJ1  D14  S00080 86        ; RF +X
0092   79 NOP  D14  S00081           ; RF +X
0093   80 NOP  D14  S00020           ; RF +Y
0094   81 NOP  D14  S00021           ; RF +Y
0095   82 NOP  D14  S00040           ; RF -X
0096   83 NOP  D14  S00041           ; RF -X
0097   84 NOP  D14  S00010           ; RF -Y
0098   85 JUC  D14  S00011 78        ; RF -Y
0099   86 JUC  D0   S10008 3         ; RECYCLE + SIGNAL BLANKING
0100
0101  100 LD1  D13  S0200E C4        ;
0102  101 JUC  D13  S02004 104       ;
0103  102 IJ1  D11  S00034 106       ;
0104  103 NOP  D11  S00034           ;
0105  104 NOP  D11  S00035           ;
0106  105 JUC  D11  S00035 102       ;
0107  106 LD1  D11  S00134 C5        ;
0108  107 JUC  D11  S00134 110       ;
0109  108 IJ1  D11  S00134 112       ;
0110  109 NOP  D11  S00134           ;
0111  110 NOP  D11  S00135           ;
0112  111 JUC  D11  S00135 108       ;
0113  112 LD1  D11  S00034 C4        ;
0114  113 JUC  D11  S00034 116       ;
0115  114 IJ1  D11  S00034 118       ;
0116  115 NOP  D11  S00034           ;
0117  116 NOP  D11  S00035           ;
0118  117 JUC  D11  S00035 114       ;
0119  118 LD1  D6   S0000E C6        ;
0120  119 JUC  D13  S02004 122       ;
0121  120 IJ1  D11  S00034 124       ;
0122  121 NOP  D11  S00034           ;
0123  122 NOP  D11  S00035           ;
0124  123 JUC  D11  S00035 120       ;
0125  124 LD1  D11  S00134 C7        ;
0126  125 JUC  D11  S00134 128       ;
0127  126 IJ1  D11  S00134 130       ;
0128  127 NOP  D11  S00134           ;
0129  128 NOP  D11  S00135           ;
0130  129 JUC  D11  S00135 126       ;
0131  130 LD1  D11  S00034 C6        ;
0132  131 JUC  D11  S00034 134       ;
0133  132 IJ1  D11  S00034 136       ;
0134  133 NOP  D11  S00034           ;
0135  134 NOP  D11  S00035           ;
0136  135 JUC  D11  S00035 132       ;
0137  136 NOP  D18  S5000E         1 ; PHASE ALTERNATE Y
0138  137 JSA  D0   S0000E         1 ; RECYCLE
0139
0140  END                             ;
0141
0142   *        : FREE
0143   *        : FREE
0144   *        : FREE
0145   *        : FREE
0146   *        : FREE
0147   *        : FREE
0148   *        : FREE
0149   *        : FREE
0150   *        : FREE
0151   *        : FREE
0152   *        : FREE
0153   *        : FREE
0154   *        : FREE
```

What is claimed is:

1. A method of determining a nuclear magnetic resonance distribution in a region of a body situated in a steady, uniform magnetic field, including the steps of:
   (a) generating a high-frequency electromagnetic pulse in order to cause a precessional motion of the magnetization of nuclei in the body about the field direction of the steady magnetic field, thus generating a resonance signal,
   (b) then applying at least one gradient magnetic field during a preparation period,
   (c) then taking a set of n signal samples of the resonance signal during a measurement period,
   (d) then repeating, each time after a waiting period, a measurement cycle comprising the steps of generating said electromagnetic pulse, applying said gradient field and taking said samples, the measurement cycle being repeated n' times and during each repetition of the measurement cycle the integral of the intensity of at least one gradient field over the preparation period having a different value so as to provide a matrix of n' rows of n signal samples from which, after Fourier transformation thereof, an image of the distribution of the induced nuclear magnetization is determined, wherein during the various measurement cycles which succeed one another with respect to a corresponding succession of values of the integral of the intensity of the gradient field over the preparation period, the resonance signals are excited in such a way that there is an additional difference, $\Delta\psi$, between the phases of the resonance signals associated with successive rows of the matrix, the additional phase differences being compensated for for Fourier transformation of values present in columns of the matrix.

2. A method as claimed in claim 1, wherein the phase difference $\Delta\psi$ is equal to $\pi$ rad/s or to $(n'-1)\cdot\pi/n'$ rad/s, n' being the number of rows.

3. A method as claimed in claim 2, wherein the number of rows is even, the additional phase difference $\Delta\psi$ is equal to $\pi$ rad/s which is obtained by alternating excitation of the resonance signals in phase opposition in the measurement cycles for the successive rows, and the values either in the even rows or in the odd rows are inverted for Fourier transformation of values present in columns of the matrix.

4. A method as claimed in claim 3, in which the value of the integral of the intensity of the gradient field over the preparation period is incremented by the same amount for each subsequent measurement cycle, and the resonance signal is alternately excited in phase opposition during the successive measurement cycles, the value of the signal samples of each second set of signal samples being inverted for Fourier transformation of the values in the columns.

5. A method as claimed in claim 3 or 4, wherein during the Fourier transformation, first a one-dimensional Fourier transformation is performed on the rows of the matrix, after which the transformed values in every second row are inverted and a Fourier transformation is performed over the columns.

6. A method of determining a nuclear magnetic resonance distribution in a three-dimensional region of a body situated in a steady, uniform magnetic field, including the steps of:
   (a) generating a high-frequency electromagnetic pulse in order to cause a precessional motion of the magnetization of nuclei in the body about the field direction of the steady magnetic field, thus generating a resonance signal,
   (b) then applying, during a preparation period, at least a first and a second preparatory gradient magnetic field whose field directions are mutually perpendicular,
   (c) then taking, during a measurement period, a set of n sampling signals of the resonance signal,
   (d) then repeating, each time after a waiting period, a measurement cycle comprising the steps of generating said electromagnetic pulse, applying said gradient field and taking said samples, the measurement cycle being repeated m × n' times and during said repetitions of said measurement cycle a first integral which comprises the integral of the intensity of the first gradient field over the preparation period having m different values while a second integral which comprises the integral of the intensity of the second gradient field over the preparation period having n' different values in order to provide m planes each with n' rows of n sampling signals, in a three-dimensional matrix from which, after Fourier transformation thereof, an image of the distribution of the induced nuclear magnetization in a three-dimensional region of a body is determined,
wherein the resonance signal is alternately excited in phase opposition during the various measurement cycles which succeed one another with respect to a corresponding succession of values of the integral of the intensity of the first gradient field over the preparation period so that there is an additional difference, $\Delta\psi$, between the phases of the resonance signals generated during successive measurement cycles, the additional phase differences being compensated for for Fourier transformation of values from the m planes.

7. A method as claimed in claim 6, wherein the additional phase difference $\Delta\psi$ is equal to $\pi$ rad/s or to $(m-1)\cdot\pi/m$ rad/s, m being the number of planes.

8. A method as claimed in claim 7 for determining a nuclear magnetic resonance distribution in a three-dimensional regin of a body, wherein the number of planes, m, is even, the additional phase difference is $\pi$ rad/s and is obtained by alternating excitation of the resonance signals in phase opposition in the successive measurement cycles, and the values in every second plane are inverted for Fourier transformation of the values of the signal samples which are present in the m planes of the matrix.

9. A method as claimed in claim 7, wherein all the values in every second plane are inverted.

10. A method as claimed in claim 8, wherein the value of said first integral remains constant at a given one of said m values during a set of n' successive measurement cycles, during which set of said n' measurement cycles the value of the second integral increases in a step-wise manner from cycle to cycle, and at the end of said set of n' measurement cycles the value of said first integral changes to another one of said m values and remains constant for another set of n' measurement cycles, the phase of said resonance signal being reversed with each change in the value of said first integral and the values of said matrix being inverted either in the odd rows of the odd planes and the even rows of the even planes or in the even rows of the odd planes and the odd rows of the even planes.

11. A method of determining a nuclear magnetic resonance distribution in a region of a body which is situated in a steady uniform magnetic field extending in a first direction, including the steps of:
  (a) generating a high-frequency electromagnetic pulse in order to cause a precessional motion of the magnetization of nuclei in the body about the first field direction, thus generating a resonance signal,
  (b) then applying, during a preparation period, at least one gradient magnetic field,
  (c) then generating a 180° high-frequency electromagnetic pulse at least once in order to reverse the direction of the nuclear magnetization, thus generating a nuclear spin echo signal,
  (d) then taking a set of n signal samples of the echo signal during a measurement period,
  (e) then repeating, each time after a waiting period, a measurement cycle comprising steps (a), (b), (c) and (d), the measurement cycle being repeated n' times and during each repetition of the measurement cycle the integral of the intensity of at least one gradient field over the preparation period having a different value in order to obtain a matrix of n' rows of n signal samples from which, after Fourier transformation thereof, an image of the distribution of the induced nuclear magnetization is determined, wherein the 180° electromagnetic pulse is alternately generated in phase opposition during the various measurement cycles which succeed one another with respect to a corresponding succession of values of the integral of the intensity of the gradient field over the preparation period.

12. A device for determining the nuclear magnetic resonance distribution in a region of a body, comprising:
  (a) means for generating a steady, uniform magnetic field,
  (b) means for generating a high-frequency electromagnetic excitation pulse so as to produce precessional motion of the magnetization of nuclei in the body thereby generating a resonance signal,
  (c) means for generating at least one gradient magnetic field during a preparation period so as to condition said resonance signal,
  (d) sampling means for sampling said resonance signal after conditioning thereof so as to obtain a set of n sample signals,
  (e) processing means for processing said sample signals, and
  (f) control means for controlling at least said radiation generating means, said gradient field generating means, said sampling means and said processing means so as to generate and sample a plurality of said resonance signals, each resonance signal being generated and sampled after conditioning thereof during a respective one of a plurality of measurement cycles which follow one another with a waiting period between successive cycles, the control means supplying the gradient field generating means with control signals for adjusting the intensity and/or the duration of at least one gradient magnetic field so that the integral of the intensity over the duration of said at least one gradient magnetic field is different after each waiting period, the control means comprising programmed computer means for generating and applying further control signals to the pulse generating means in accordance with a programmed schedule so that said pulse generating means generates a pulse having either a first phase or a second phase during a measurement cycle, the second phase being shifted 180° with respect to the first phase, said device further comprising means for storing said sample signals obtained during successive measurement cycles so as to obtain a matrix of n' rows, each row of said matrix being comprised of n signal samples obtained during a respective one of said measurement cycles.

13. A device as claimed in claim 12 in which after each waiting period, the control means applies control signals to the means for generating a gradient magnetic field such that said integral is changed in a step-like manner after each waiting period, and wherein the further control signals control the pulse generating means so that the pulse generating means alternately generates either a pulse having the first phase or a pulse having the second phase during successive measurement cycles, the processing means being adapted for inverting either every first and every second subsequent set of n signal samples or every second and every subsequent second set of n signal samples.

* * * * *